United States Patent
Chiang et al.

(10) Patent No.: US 6,365,324 B1
(45) Date of Patent: *Apr. 2, 2002

(54) PHOTOSENSITIVE COMPOSITION

(75) Inventors: Lin-chiu Chiang, Niigata; Jenq-Tain Lin; Nobuyuki Sensui, both of Kitaibaraki, all of (JP)

(73) Assignee: Nippon Mektron, Limited (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/277,267

(22) Filed: Mar. 26, 1999

(30) Foreign Application Priority Data

May 14, 1998 (JP) ............................................ 10-150744
Aug. 7, 1998 (JP) ............................................ 10-236386

(51) Int. Cl.$^7$ .............................. G03C 1/73; G03F 7/037
(52) U.S. Cl. ................................. 430/281.1; 430/270.1; 430/927; 528/38; 528/353
(58) Field of Search ................................. 525/430, 476, 525/431; 528/38, 353, 477

(56) References Cited

U.S. PATENT DOCUMENTS

| | | | | |
|---|---|---|---|---|
| 5,693,379 A | * | 12/1997 | Sugimori et al. | 428/1 |
| 5,859,181 A | * | 1/1999 | Zhao et al. | 528/353 |
| 5,942,592 A | * | 8/1999 | Zhao et al. | 528/26 |
| 6,071,667 A | * | 6/2000 | Hagiwara et al. | 430/197 |
| 6,096,480 A | * | 8/2000 | Ishikawa et al. | 430/283.1 |
| 6,096,850 A | * | 8/2000 | Chiang et al. | 528/38 |
| 6,117,510 A | * | 9/2000 | Ishikawa et al. | 428/41.7 |

FOREIGN PATENT DOCUMENTS

| | | | |
|---|---|---|---|
| DE | 197 15 479 A | | 12/1997 |
| DE | 197 56 554 A | | 6/1998 |
| EP | 0 284 803 A | | 10/1988 |
| EP | 0 317 941 A | | 5/1989 |
| EP | 0 814 109 A | | 12/1997 |
| EP | 0 905 168 A | | 3/1999 |
| JP | A 57-131227 | | 8/1982 |
| JP | A 59-145216 | | 8/1984 |
| JP | 04108879 | * | 4/1992 |
| JP | 10231362 | * | 9/1998 |
| JP | 11158278 | * | 6/1999 |

* cited by examiner

Primary Examiner—Janet Baxter
Assistant Examiner—Yvette M. Clarke
(74) Attorney, Agent, or Firm—Baker & Daniels

(57) ABSTRACT

Polyimide is produced by reacting two kinds of diamine compounds consisting of diaminopolysiloxane and a carboxyl group-containing diamine or three kinds of diamine compounds consisting of diaminopolysiloxane, a carboxyl group-containing diamine and an aromatic or alicyclic diamine with a 4,4'-(hexafluoroisopropylidene)diphthalic acid dianhydride, thereby once forming a polyamic acid, and subjecting the polyamic acid to polyimidization reaction. The resulting polyimide itself is soluble in low boiling organic solvents for general purpose use, typically methyl ethyl ketone. A photosensitive composition comprising the polyimide, a photo crosslinking agent and a photo acid-generating agent forms a negative type polyimide pattern upon development with an aqueous alkali solution.

4 Claims, No Drawings

PHOTOSENSITIVE COMPOSITION

BACKGROUND OF THE INVENTION

1. Field of the Invention

The present invention relates to a photosensitive composition, and more particularly to a photosensitive composition capable of giving a negative type polyimide pattern upon development with an aqueous alkaline solution.

2. Description of Related Art

So far used photosensitive resins are typically polyester acrylate, epoxy acrylate, etc. To obtain a desired pattern upon exposure of these photosensitive resins to light, an organic solvent is used as a developing agent. Such organic solvent developing type, photosensitive resins have such a serious problem as an adverse effect on the environments in addition to safety or sanitary problem during working due to the use of the organic solvent.

In place of the organic solvent developing type, photosensitive resins having such problems, alkali-developable photosensitive resins based on novolak resins, polyvinylphenol, etc. have been proposed and almost all of them have been utilized as positive type thin films having a thickness of a several μm, but these positive type thin films have not always satisfied the heat resistance, preservation stability, pattern embedability, etc. required by FPC (flexible printed substrate) applications.

Furthermore, polyimide resins themselves are insoluble in an organic solvent and therefore have so far relied on such a method of once converting them to organic solvent-soluble polyamic acids, followed by their polyimidization. However, some of polyimide resins themselves are soluble in an organic solvent. For example, polyimide resins disclosed in JP-A-57-131227 and polyamide-imide resins disclosed in JP-A-59-145216 are said to be soluble in an organic solvent and photosensitive. However, the organic solvent for that purpose is aprotic polar solvents including dimethyl-formamide, whereas acetone, benzene, cyclohexanol, etc., on the other hand, are used there for deposition of the resins. That is, the resins are insoluble in these latter organic solvents.

SUMMARY OF THE INVENTION

An object of the present invention is to provide a photosensitive composition containing a polyimide as photosensitive component which is by itself soluble in low boiling organic solvents for general purpose use, typically methyl ethyl ketone, and capable of giving a negative type pattern upon development with an aqueous alkali solution.

According to the present invention, there is provided a photosensitive composition, which comprises polyimide, comprising a copolymer of two kinds of diamine compounds consisting of diaminopolysiloxane and a carboxyl group-containing diamine or three kinds of diamine compounds consisting of diaminopolysiloxane, a carboxyl group-containing diamine and an aromatic or alicyclic diamine with a 4,4'-(hexafluoroisopropylidene)-diphthalic acid dianhydride, a photo crosslinking agent and a photo acid-generating agent.

A polyimide comprising a copolymer of two kinds of diamine compounds consisting of diaminopolysiloxane and a carboxyl group-containing diamine or three kinds of diamine compounds consisting of diaminopolysiloxane, a carboxyl group-containing diamine and an aromatic or alicyclic diamine with a 4,4'-(hexafluoroisopropylidene) diphthalic acid dianhydride, can be produced by reacting two kinds of diamine compounds consisting of diaminopolysiloxane and a carboxyl group-containing diamine or three kinds of diamine compounds consisting of diaminopolysiloxane, a carboxyl group-containing diamine and an aromatic or alicyclic diamine with a 4,4'-(hexafluoroisopropylidene)diphthalic acid dianhydride, thereby once forming polyamic acid, and then polyimidizing the polyamic acid. The resulting polyimide can be formed into a photosensitive composition by adding a photo crosslinking agent and a photo acid-generating agent thereto.

DETAILED DESCRIPTION OF THE INVENTION

For diaminopolysiloxane, one component of two or three kinds of diamine compounds, which react with the carboxylic acid anhydride, compounds represented by the following general formula can be used:

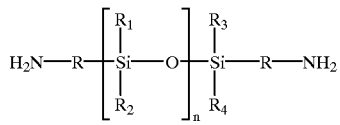

where R is a divalent hydrocarbon group having 2 to 6 carbon atoms, preferably 3 to 5 carbon atoms; $R_1$ to $R_4$ are each a lower alkyl group having 1 to 5 carbon atoms or a phenyl group; and n is an integer of 0 to 30, preferably 4 to 12.

The compounds include, for example, compounds whose R and $R_1$ to $R_4$ are the following substituents in combination:

| R | $R_1$ | $R_2$ | $R_3$ | $R_4$ |
|---|---|---|---|---|
| $(CH_2)_3$ | $CH_3$ | $CH_3$ | $CH_3$ | $CH_3$ |
| $(CH_2)_4$ | $CH_3$ | $CH_3$ | $CH_3$ | $CH_3$ |
| $(CH_2)_3$ | $CH_3$ | $C_6H_5$ | $CH_3$ | $C_6H_5$ |
| p-$C_6H_4$ | $CH_3$ | $CH_3$ | $CH_3$ | $CH_3$ |

Actually, the following commercially available products can be used: Toshiba Silicone products TSL9386, TSL9346 and TSL9306; Toray Dow-Corning product BY16-853U, Shinetsu Chemical product X-22-161AS, Nippon Unicar product F2-053-0 1, etc.

The carboxyl group-containing diamine for use in the present invention includes, for example, 3,5-diaminobenzoic acid, 2,5-diaminoterephthalic acid, 2,2'-bis(aminobenzoic acid), etc. These carboxyl group-containing diamines, when the produced polyimide is to be used as a photosensitive resin, can be used so that the carboxyl group content is about 0.6 to about 3.0% by mole, preferably about 0.7 to about 2.5% by mole in the repetition units [(a) and (b) or (a) to (c) which follow]. Below about 0.6% by mole, the polyimide will be less soluble in an aqueous alkali solution, whereas above about 3.0% by mole it will be too soluble therein.

The aromatic or alicyclic diamine for use in the present invention includes, for example, aromatic diamines such as 3,3'-bis(aminophenyl)-ether, 4,4'-bis(aminophenyl)ether, 1,3-bis(4-aminophenoxy)benzene, bis[4-(4-aminophenoxy) phenyl]sulfone, bis[4-(3-aminophenoxy) phenyl]sulfone, 4,4'- diaminodiphenyosulfone, 3,3'-diminodiphenylsulfone, etc. or alicyclic diamines such as 1,3-bis(aminomethyl)

cyclohexane, 4,4'-bis(aminocyclohexyl)methane, 3,3'-bis (aminocyclohexyl)methane, etc.

When two kinds of diamine compounds are used, diaminopolysiloxane is used in a proportion of about 20 to about 80% by mole, preferably about 40 to about 70% by mole, whereas carboxyl group-containing diamine is used in a proportion of about 20 to about 80% by mole, preferably about 30 to 60% by mole, where total is 100% by mole. When less than about 20% by mole of diaminopolysiloxane is used, no film can be formed, whereas above about 80% by mole development by an aqueous alkali solution cannot be made any more. When less than about 20% by mole of carboxyl group-containing diamine is used, light-unexposed regions will be insoluble in the aqueous alkali solution, whereas above about 80% by mole even light-exposed regions are soluble, but the difference in dissolution rate between the light-exposed regions and the light-unexposed regions will be smaller.

When three kinds of diamine compounds are used, diaminopolysiloxane is used in a proportion of about 20 to about 70% by mole, preferably about 30% to about 50% by mole, carboxyl group-containing diamine in a proportion of about 20 to about 70% by mole, preferably about 30 to about 50% by mole, and aromatic or alicyclic diamine in a proportion of about 10 to about 60% by mole, preferably about 20 to about 40% by mole, where total is 100% by mole. When the aromatic or alicyclic diamine is used in such a proportion, the polyimide resulting there from will have a higher light transmission in the ultraviolet zone, for example, a satisfactory photosensitivity even to a film as thick as 50 µm. When the aromatic or alicyclic diamine is used in a proportion of more than about 60% by mole, polyimide will have a reduced solubility in the lower boiling organic solvents for general purpose use.

Reaction between a mixture of diamine compounds and a 4,4'-(hexafluoroisopropylidene)diphthaiic acid dianhydride represented by the following formula:

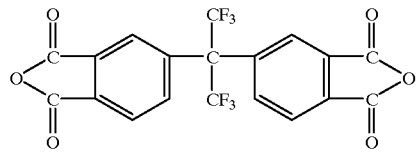

is carried out preferably in an aprotic polar solvent such as dimethyl-formamide, dimethylacetamide, N-methyl-2-pyrrolidone, etc., but can be carried out even in a polar solvent such as cresol, pyridine, etc. Actually, the carboxylic acid anhydride is dropwise added to a solution of the mixture of diamino compounds in the polar solvent at about 0° to about 10° C. and subjected to reaction at about 30° C. to 150° C., preferably at about 50° to about 100° C., for about 2 to about 8 hours.

The resulting reaction product is polyamic acid as a polyimide precursor, and thus is subjected to dehydration reaction for polyimidization. Dehydration reaction is carried out, after adjustment of the concentration to about 10 to about 20% by weight with a polar organic solvent, if necessary, at a temperature of about 150° to about 250° C., preferably about 180° to about 200° C., for about 2 to about 6 hour, preferably about 2 to about 4 hour, preferably by using a dehydrating agent such as acetic anhydride, pyridine, etc., where it is also effective to use toluene, etc. to subject the formed water to azeotropic distillation.

Siloxanepolyimide, which is a polyimidazation reaction product, can be presumed to be a block copolymer having repetition units (a) and (b) represented by the following general formulae, in case of using two kinds of diamine compounds, consisting of diaminopolysiloxane and 3,5-diaminobenzoic acid as carboxyl group-containing diamine:

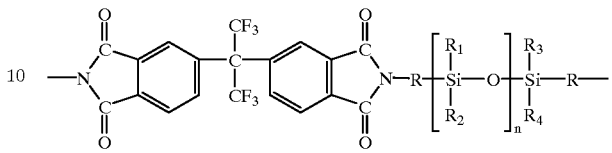

(a)

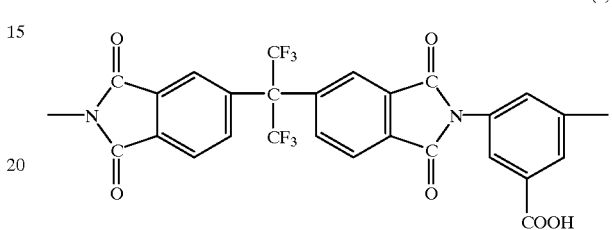

(b)

Its weight-average molecular weights Mw (determined by GPC in terms of polystyrene) are about 10,000 to about 50,000, preferably about 15,000 to about 30,000.

Furthermore, in case of using three kinds of diamine compounds consisting of diaminopolysiloxane, 3,5-diaminobenzoic acid and 4,4'-bis(aminophenyl)ether, it can be presumed that a block copolymer having further repetition units (c) represented by the following general formula in addition to the repetition units (a) and (b) represented by the foregoing general formulae:

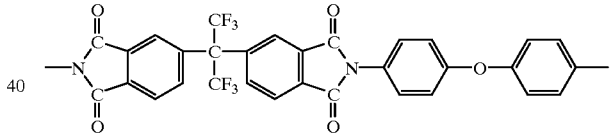

(c)

Its weight-average molecular weights Mw are about 10,000 to about 100,000, preferably about 20,000 to about 50,000, which is higher than that in case of using the two kinds of diamine compounds.

The thus obtained copolymer is soluble in low boiling organic solvents such as acetone, methyl ethyl ketone, methyl isobutyl ketone, tetrahydrofuran, ethyleneglycol monomethyl ether, chloroform, etc. or aprotic polar solvents such as dimethylformamide, dimethylacetamide, N-methyl-2-pyrrolidone, etc., and thus can be used as an organic solvent solution having a concentration of about 20—about 50 wt. %, preferably about 30—about 45 wt. %. The solution is admixed with a photo crosslinking agent and a photo acid-generating agent, and then dropwise provided onto an alkali-resistant substrate such as a quartz glass substrate, a copper substrate, etc. and subjected to spin coating (about 500—about 2,500 rpm, preferably about 500—about 1,000 rpm, for about 10 seconds) to form a film having a thickness of about 25 to about 50 µm, followed by prebaking at a temperature of about 70°—about 100° C., preferably about 80°—about 90° C. for about 5—about 10 minutes, thereby removing the solvent.

The thus obtained photosensitive polyimide-coated substrate is covered with a desired mask thereon and subjected to ultraviolet ray exposure at a dose of about 150—about 600 mJ/cm$^2$, preferably about 200—about 450 mJ/cm$^2$ and then to postexposure baking at a temperature of about 110°—about 140° C., preferably about 120°—about 135° C. for about 5—about 10 minutes, followed by development with an aqueous solution of an alkaline compound such as potassium hydroxide, sodium carbonate, tetramethylammonium hydroxide, etc., at a temperature of about 30°—about 50° C., thereby giving a clear negative type pattern. The developing solution herein used has a concentration of about 0.5—about 4% by weight, preferably about 0.5—about 3% by weight, and the developing time is preferably within about one minute. After the development, water washing, drying and curing at about 160° C. for about 2 hours are carried out.

Preferable photo crosslinking agent for use in the present invention includes, hydroxymethyl group-containing substituted phenols such as 2-hydroxymethyl-4,6-dimethylphenol, 1,3,5-trihydroxymethylbenzene, 3,5-dihydroxymethyl-4-methoxytoluene[2,6-bis(Hydroxymethyl)-p-cresol], etc. The photo crosslinking agent can be used in a proportion of about 1 to about 50 parts by weight, preferably about 3 to about 15 parts by weight, per 100 parts by weight of polyimide. Below about 1 parts by weight, the cross-linking density is so low that no satisfactory polymer matrix is formed and thus the film will be dissolved in the aqueous alkali solution, whereas above 50 parts by weight the solubility of the composition is lowered, so that a crystalline pattern will be formed on the coated surface.

Photo acid-generating agent such as nitrobenzyl-9,10-diethoxy-anthracene-2-sulfonate, diphenyliodonium-9,8-demethoxyanthracene sulfonate, etc. can be used in a proportion of about 1 to about 50 parts by weight, preferably about 3 to about 20 parts by weight, per 100 parts by weight of polyimide. Below about 1 parts by weight, FPC pattern will be partially dissolved in the aqueous alkali solution and will be narrowed, whereas above about 50 parts by weight a crystalline pattern will appear on the coated surface as in the case of the photo crosslinking agent.

The present photosensitive composition formed by adding a photo crosslinking agent and a photo acid-generating agent to a polyimide soluble in low boiling organic solvent for general purpose use is developable in an aqueous alkali solution to form a negative type polyimide pattern with a distinguished patternability. When an aromatic or alicyclic diamine is simultaneously used as a diamine compound, a satisfactory photosensitivity even to a thicker film can be given. Particularly in case of using an alicyclic amine, a satisfactory photosensitivity even to a film as thick as 70 μm can be given.

PREFERRED EMBODIMENTS OF THE INVENTION

The present invention will be described in detail below, referring to Examples and Comparative Examples.

EXAMPLE 1

18.24 g (0.12 moles) of 3,5-diaminobenzoic acid and 158.4 g (0.18 moles) of diaminopolysiloxane (BY16-853U, product of Dow-Corning Co., USA; amine equivalent: 440) were charged into a separable flask having a capacity of 1L and 133.2 g (0.3 moles) of 4,4'-(hexafluoroisopropylidene) diphthalic acid dianhydride as a solution in 385 g of N-methylpyrrolidone was dropwise added thereto, keeping at a temperature of about 0°—about 10° C. by ice cooling. After the dropwise addition, the solution was heated to 50° C. and stirred at that temperature for 4 hours, and then heated to 200° C. and subjected to dehydration reaction at that temperature for 3 hours. After the reaction, the reaction mixture was put into water and the product was reprecipitated to obtain carboxyl group-containing polyimide (carboxyl group content: 0.67% by mole).

100 parts by weight of the resulting carboxyl group-containing polyimide was admixed with 12.5 parts by weight of 2,6-bis(hydroxymethyl)-p-cresol as a photo crosslinking agent and 12.5 parts by weight of diphenyliodonium-9,10-methoxyanthracene-2-sulfonate as a photo acid-generating agent, and prepared into a solution having a solid concentration of 40 wt. % in a solvent mixture of methyl ethyl ketone and ethyleneglycol monomethyl ether in a ratio of 1:1 by volume.

The thus prepared photosensitive polyimide solution was spin coated onto the lustrous surface of a copper foil at 600 rpm for 10 seconds, prebaked at 90° C. for 10 minutes to make once it into a film state having a thickness of 50 μm, covered with a mask (Photonix RP-1, product of Hitachi Chemical Co., Japan) thereon and exposed to ultraviolet rays at 300 mJ/cm$^2$. Then, after postexposure baking at 130° C. for 5 minutes, the mask-covered polyimide film was developed with an aqueous 3 wt. % sodium carbonate solution at 40° C. for 60 seconds, and then washed with water at room temperature for one minute to obtain a negative type polyimide pattern having a film thickness of 50 μm (measured by film thickness meter).

Electron microscope observation of the resulting negative type polyimide pattern revealed that the pattern and line width were each 100 μm at 100/100 (μm), showing a distinguished patternability without any swelling.

Furthermore, a polyimide film obtained by coating onto a polytetra-fluoroethylene sheet, followed by light exposure was cured at 160° C. for two hours, and then subjected to a heat resistance test (180° C. for 1,000 hours), a high temperature-high humidity test (85° C. and 85%RH for 1,000 hours), or a low temperature resistance test (−50 ° C. for 1,000 hours). Bonding strength after respective tests was determined by a cross cut method and 100/100 resulted in all the tests.

EXAMPLE 2

In Example 1, the amount of 3,5-diaminobenzoic acid was changed to 20.52 g (0.135 moles), and the amount of diaminopolysiloxane to 145.2 g (0.165 moles). 100 parts by weight of the resulting carboxyl group-containing polyimide (carboxyl group content: 0.79% by mole) was admixed with 12.5 parts by weight of 2,6-bis(hydroxymethyl)-p-cresol as a photo crosslinking agent and 12.5 parts by weight of diphenyliodonium-9,10-methoxyanthracene-2-sulfonate as a photo acid-generating agent, and prepared into a solution having a solid concentration of 40 wt. % in a solvent mixture of methyl ethyl ketone and ethyleneglycol monomethyl ether in a ratio of 1:1 by volume.

The thus prepared photosensitive polyimide solution was spin coated onto the lustrous surface of a copper foil at 600 rpm for 10 seconds, prebaked at 90° C. for 10 minutes to make once it into a film state having a thickness of 50 μm, covered with a mask (Photonix RP-1, product of Hitachi Chemical Co., Japan) thereon and exposed to ultraviolet rays at 300 mJ/cm$^2$. Then, after postexposure baking at 130° C. for 5 minutes, the mask-covered polyimide film was developed with an aqueous 3 wt. % sodium carbonate solution at 40° C. for 60 seconds, and then washed with water at room temperature for one minute to obtain a negative type polyimide pattern having a film thickness of 52 μm (measured by film thickness meter).

Electron microscope observation of the resulting negative type polyimide pattern revealed that the pattern and line width were each 100 μm at 100/100 (μm), showing a distinguished patternability without any swelling.

Furthermore, a polyimide film obtained by coating onto a polytetra-fluoroethylene sheet, followed by light exposure was cured at 160° C. for two hours, and then subjected to a heat resistance test (180° C. for 1,000 hours), a high temperature-high humidity test (85° C. and 85%RH for 1,000 hours), or a low temperature resistance test (−50° C. for 1,000 hours). Bonding strength after respective tests was determined by a cross cut method and 100/100 resulted in all the tests.

The carboxyl group-containing polyimides obtained in the foregoing Examples 1 to 2 had weight-average molecular weights Mw of about 12,000 to about 16,000.

COMPARATIVE EXAMPLE 1

In Examples 1 to 2, when no carboxyl group-containing diamine compound was used, all the resulting polyimides showed a remarkable light transmittance in the ultraviolet region, but had no carboxyl group soluble in an aqueous alkali solution and thus could not be developed with an aqueous alkali solution.

COMPARATIVE EXAMPLE 2

In Example 1, the amount of 3,5-diaminobenzoic acid was changed to 13.52 g (0.09 moles) and the amount of diaminopolysiloxane to 184.8 g (0.21 mole). The resulting carboxyl group-containing polyimide had a carboxyl group content of 0.55% by mole and solubility of light-unexposed regions in an aqueous 3 wt. % $Na_2CO_3$ solution was not satisfactory.

COMPARATIVE EXAMPLE 3

In Example 1, when a photosensitive composition was prepared without the photo acid-generating agent, the resulting polyimide film was not photosensitive even if the dose was increased from 300 $mJ/cm^2$ to 1,000 $mJ/cm^2$ and was dissolved even in an aqueous 1 wt. % $Na_2CO_3$ solution.

COMPARATIVE EXAMPLE 4

In Example 1, when a photosensitive composition was prepared without the photo crosslinking agent, the resulting polyimide film was not photosensitive, even if the dose was increased from 300 $mJ/cm^2$ to 1,000 $mJ/cm^2$, and was dissolved even in an aqueous 1 wt. % $Na_2CO_3$ solution.

COMPARATIVE EXAMPLE 5

In Example 1, when 96.6 g (0.3 moles) of benzophenone tetracarboxylic acid dianhydride was used as a tetracarboxylic acid dianhydride, the resulting carboxyl group-containing polyimide (carboxyl group content: 0.78% by mole) showed no substantial light transmission in the ultraviolet region, particularly at wave lengths of 350 to 450 nm.

COMPARATIVE EXAMPLE 6

In Example 1, when 93 g (0.3 moles) of oxydiphthalic acid dianhydride was used as a tetracarboxylic acid dianhydride, the resulting carboxyl group-containing polyimide (carboxyl group content: 0.78% by mole) showed a light transmittance of not more than 0.4 in the ultraviolet region, which was inferior to that of Example 1. Furthermore, solubility of the photosensitive composition in the solvent mixture was only 20% by weight.

EXAMPLE 3

18.2 g (0.12 moles) of 3,5-diaminobenzoic acid, 18.0 g (0.09 moles) of 4,4'-bis(aminophenyl) ether and 79.2 g (0.09 moles) of diaminopolysiloxane (BY16-853U) were charged into a separable flask having a capacity of 1L and 133.2 g (0.3 moles) of 4,4'-(hexafluoroisopropylidene)diphthalic acid dianhydride was added thereto as powders, keeping at a temperature of about 0°—about 10° C. by ice cooling. Then, 375 g of N-methyl-2-pyrrolidone was added thereto to dissolve the acid anhydride. After the dissolution, the solution was heated to 50° C. and stirred at that temperature for 3 hours, and then heated to 200° C. and subjected to dehydration reaction at that temperature for 3 hours. After the reaction, the reaction mixture was put into water and the product was reprecipitated to obtain carboxyl group-containing polyimide (carboxyl group content: 0.85% by mole).

100 parts by weight of the resulting carboxyl group-containing polyimide was admixed with 12.5 parts by weight of 2,6-bis(hydroxy-methyl)-p-cresol and 12.5 parts by weight of diphenyliodonium-9,10-methoxyanthracene-2-sulfonate, and prepared into a solution having a solid content concentration of 40% by weight in a solvent mixture of methyl ethyl ketone and ethyleneglycol monomethyl ether in a ratio of 3:7 by volume.

The thus prepared plustosensitive polyimide solution was spin coated onto the lustrous surface of a copper foil at 500 rpm for 10 seconds; prebaked at 90° C. for 10 minutes to make once it into a film state having a thickness of 50 μm, covered with a mask (Photonix PR-1) thereon and exposed to ultraviolet ray at 300 $mJ/cm^2$. Then, after postexposure baking at 120° C. for 5 minutes, the mask-covered polyimide film was developed with an aqueous 3 wt. % sodium carbonate solution at 40° C. for 60 seconds, and then washed with water at room temperature for one minute to obtain a negative type polyimide pattern.

Electron microscope observation of the resulting negative type polyimide pattern revealed that the pattern and line width were each 100 μm at 100/100 (μm), showing a good patternability without any swelling.

EXAMPLE 4

In Example 3, 40.7 g (0.09 moles) of 4,4'-[bis(3-aminophenoxy)-phenyl]-sulfone was used in place of 4,4'-bis(aminophenyl)ether. The resulting negative type polyimide pattern showed a good patternability as in Example 3. Carboxyl group content of the carboxyl group-containing polyimide was 0.76% by mole.

EXAMPLE 5

In Example 3, 26.3 g (0.09 moles) of 1,3-bis(4-aminophenoxy)benzene was used in place of 4,4'-bis(aminophenyl)ether. The resulting negative type polyimide pattern had a good patternability as in Example 3. Carboxyl content of the carboxyl group-containing polyimide was 0.83% by mole.

EXAMPLE 6

In Example 3, 12.8 g (0.09 moles) of 1,3-bis(aminomethyl)cyclohexane was used in place of 4,4'-bis(aminophenyl) ether. The resulting negative type polyimide pattern had a good patternability as in Example 3. Carboxyl content of the carboxyl group-containing polyimide was 0.87% by mole.

Carboxyl group-containing polyimides obtained in the foregoing Examples 3 to 6 had weight average molecular weights Mw of about 30,000 to about 50,000.

What is claimed is:

1. A polyimide soluble in an aqueous solution of an alkaline compound, which comprises a copolymer of three kinds of diamine compounds consisting of diaminopolysiloxane, a carboxyl group-containing diamine and an aromatic or alicyclic diamine with a 4,4'-(hexafluoroisopropylidene)diphthalic acid dianhydride.

2. A polyimide soluble in an aqueous solution of an alkaline compound according to claim 1, wherein the three kinds of diamine compounds consist of 20 to 70% by mole of the diaminopolysiloxane 20 to 70% by mole of the carboxyl group-containing diamine and 10 to 60% by mole of the aromatic or alicyclic diamine, total being 100% by mole.

3. A process for producing a polyimide soluble in an aqueous solution of an alkaline compound, which comprises reacting three kinds of diamine compounds consisting of diaminopolysiloxane, a carboxyl group-containing diamine and an aromatic or alicyclic diamine with a 4,4'-(hexafluoroisopropylidene) diphthalic acid dianhydride, thereby once forming a polyamic acid, and then subjecting the polyamic acid to polyimidization reaction.

4. A process for producing a polyimide soluble in an aqueous solution of an alkaline compound according to claim 3, wherein the three kinds of diamine compound consist of 20 to 70% by mole of the diaminopolysiloxane, 20 to 70% by mole of the carboxyl group-containing diamine and 10 to 60% by mole of the aromatic or alicyclic diamine, total being 100% by mole.

* * * * *